(12) United States Patent
Lee et al.

(10) Patent No.: US 12,519,473 B2
(45) Date of Patent: Jan. 6, 2026

(54) CAPACITANCE SENSOR ARRAY CHIP WITH PROGRAMMABLE FUSION PIXELS, SAMPLING DEVICE THEREOF AND CONTROLLING SYSTEM THEREOF

(71) Applicant: National Yang Ming Chiao Tung University, Hsinchu (TW)

(72) Inventors: Chen-Yi Lee, Hsinchu (TW); Lin-Hung Lai, Hsinchu (TW); Wen-Yue Lin, Hsinchu (TW)

(73) Assignee: National Yang Ming Chiao Tung University, Hsinchu (TW)

( * ) Notice: Subject to any disclaimer, the term of this patent is extended or adjusted under 35 U.S.C. 154(b) by 116 days.

(21) Appl. No.: 18/668,308

(22) Filed: May 20, 2024

(65) Prior Publication Data

US 2025/0357930 A1    Nov. 20, 2025

(51) Int. Cl.
*H03K 19/17704*   (2020.01)
*H03K 5/134*   (2014.01)
*H03K 19/00*   (2006.01)
*H03K 19/0948*   (2006.01)
*H03K 19/096*   (2006.01)

(52) U.S. Cl.
CPC ....... *H03K 19/17708* (2013.01); *H03K 5/134* (2014.07); *H03K 19/0016* (2013.01); *H03K 19/0948* (2013.01); *H03K 19/0963* (2013.01)

(58) Field of Classification Search
CPC ............... H03K 19/173; H03K 19/177; H03K 19/17704; H03K 19/17708; H03K 19/17716; G06F 3/041; G06F 3/04156; G06F 3/041662
See application file for complete search history.

(56) References Cited

U.S. PATENT DOCUMENTS

| | | | |
|---|---|---|---|
| 2013/0135008 A1* | 5/2013 | Zhang | B82Y 10/00 716/105 |
| 2018/0090616 A1* | 3/2018 | Nakagawa | H03K 19/17708 |
| 2020/0295739 A1* | 9/2020 | Zuo | H04N 25/778 |
| 2024/0310956 A1* | 9/2024 | Kim | G06F 3/0443 |

OTHER PUBLICATIONS

Lai, et al. "A 460 800 Pixels CMOS Capacitive Sensor Array With Programmable Fusion Pixels and Noise Canceling for Life Science Applications", IEEE Transactions on Circuits and Systems-II: Express Briefs, vol. 70, No. 5, May 2023.

* cited by examiner

*Primary Examiner* — Jason M Crawford
(74) *Attorney, Agent, or Firm* — Amin, Turocy & Watson, LLP (57) ABSTRACT

The present inventive concept provides a capacitance sensor array chip with programmable fusion pixels comprising: a programmable module for generating a choosing signal according to a first clock signal; a delay pulse module for generating a third clock signal according to a second clock signal and a sensing pulse signal; and multiple electrode array modules comprising a charging unit for generating a charging signal according to the sensing pulse signal; M×N electrode pixel units forming an array, wherein the electrode arrays chooses a certain pattern of the electrode units according to the choosing signal in orders and the certain pattern of the electrode units in the electrode array generates a sampling signal according to the charging signal; and a sampling unit for generating a sensing output signal according to the sampling signal and the third clock signal.

20 Claims, 9 Drawing Sheets

CAPACITANCE SENSOR ARRAY CHIP WITH PROGRAMMABLE FUSION PIXELS, SAMPLING DEVICE THEREOF AND CONTROLLING SYSTEM THEREOF

RELATED APPLICATIONS

BACKGROUND OF THE INVENTION

1. Field of the Invention

The present inventive concept generally relates to a capacitance sensor array chip, and, more particularly, to a capacitance sensor array chip with programmable fusion pixels.

2. Description of the Related Art

A CMOS Lab-on-Chip provides unprecedented applications in the field of life sciences, such as, fast medical test with digital microfluidic, cell sorting with traveling-wave dielectrophoresis, polymerase chain reaction with heating micro-electrode array (H-MEA), and so on. These applications provide lower cost, shorter operation time, smaller regent volumes, and higher throughput than traditional approaches do. Among them, a capacitive sensor array (CSA) plays a vital role in collecting electric-physical responses from the biotarget and offering a precise operation strategy.

However, it is difficult to inspect single-cell behaviors due to the size mismatch between an individual electrode and a single-cell. Converting capacitance to frequency through a ring oscillator (RO) to monitor a real-time cell proliferation is sufficient to identify cell cluster adhesion, but there is still room for improvement in the spatial resolution for observing single-cell behavior.

Therefore, there is still an urgent need for a sensing method that can balance spatial resolution and sensitivity by dynamically adopting the corresponding electrode size according to the sample size.

SUMMARY OF THE INVENTION

In light of solving the foregoing problems of the prior art, the present inventive concept provides a capacitance sensor array chip with programmable fusion pixels, a sampling device and a controlling system.

In order to solve the aforementioned problems, a first aspect of the present inventive concept provides a capacitance sensor array chip with programmable fusion pixels comprising a programmable module, a delay pulse module and multiple electrode array modules.

The programmable module is used for generating a choosing signal according to a first clock signal. The delay pulse module is used for generating a third clock signal according to a second clock signal and a sensing pulse signal. The multiple electrode array modules comprise a charging unit for generating a charging signal according to the sensing pulse signal; M×N electrode pixel units forming an array, wherein M is a positive integer greater than or equal to 1, N is a positive integer greater than or equal to 1, and wherein the electrode array module chooses a certain pattern of the electrode pixel units according to the choosing signal in orders and the certain pattern of the electrode pixel units in the electrode array module generates a sampling signal according to the charging signal; and a sampling unit for generating a sensing output signal according to the sampling signal and the third clock signal.

In an embodiment, each of the electrode pixel units comprises an electrode, a first transistor with a drain connected to the electrode and a switching logic gate. Wherein an input terminal of the switching logic gate receives the choosing signal, and an output terminal of the switching logic gate is connected to a gate of the first transistor.

In an embodiment, the choosing signal comprises an M-bit Row signal and an N-bit Column signal.

In an embodiment, the charging unit comprises a first voltage source, at least one first PMOS connected to the first voltage source and a first CMOS inverter connected to the at least one first PMOS. Wherein an input of the first CMOS inverter receives the sensing pulse signal, and an output of the first CMOS inverter outputs the charge signal.

In an embodiment, the charging unit comprises a second voltage source, a second CMOS inverter connected to the second voltage source, at least one second PMOS connected to the second CMOS inverter and a third multiplexer connected to the at least one second PMOS, wherein a first input terminal of the third multiplexer is connected to a control voltage, and when the third multiplexer selects the first input, an output current of the at least one second PMOS is controlled via the control voltage. Wherein an input terminal of the second CMOS inverter receives the sensing pulse signal, and an output terminal of the second CMOS inverter outputs the charging signal.

In an embodiment, the delay pulse module comprises a first DFF having a clock input terminal which receives the sensing pulse signal, a delay pulse delay generator (DPDG) connected to an output of the first DFF and a first multiplexer. Wherein a first input terminal of the first multiplexer is connected to an output terminal of the delay pulse delay generator, a second input terminal of the first multiplexer receives the second clock signal, and an output terminal of the first multiplexer outputs the third clock signal.

In an embodiment, the sampling unit comprises a first INV having an input terminal which receives the sampling signal, a second multiplexer having a first input terminal connected to an output terminal of the first INV, and a second DFF. Wherein a clock input of the second DFF receives the third clock signal, an input of the second DFF is connected to an output of the second multiplexer, and an output of the second DFF outputs the sensing output signal and is connected to a second input of the second multiplexer of the sampling unit of the next electrode array module to form a serial output.

In an embodiment, the first INV is a Hi-Skew inverter.

In an embodiment, the electrode pixel units are arranged as square electrodes, interleaved electrodes or aligned electrodes, and the electrode pixel units include or do not include a guard ring.

In an embodiment, the electrode pixel units are made of a top layer metal material or a sub-layer metal material.

A second aspect of the present inventive concept provides a sampling device, comprising:
  the capacitance sensor array chip with programmable fusion pixels according to the first aspect of the present inventive concept;
  a protective layer covering the capacitance sensor array chip with programmable fusion pixels;
  a container used for disposing the capacitance sensor array chip with programmable fusion pixels; and
  an insulator disposing around the capacitance sensor array chip with programmable fusion pixels to securely bond the container to the capacitance sensor array chip with programmable fusion pixels.

A third aspect of the present inventive concept provides a controlling system for controlling a capacitance sensor array chip with programmable fusion pixels to sense a sample, wherein the controlling system comprises:

the capacitance sensor array chip with programmable fusion pixels according to the first aspect of the present inventive concept; and a control unit for determining a resistance value and a capacitance value when sampling to control the electrode pixel units.

In an embodiment, the control unit comprises a shift register to determine the resistance value and capacitance value when sampling to establish an equivalent electrode size.

In an embodiment, the shift register is an (M+N) bit shift register.

In an embodiment, the controlling system further comprises a programmable substrate connected to the capacitance sensor array chip with programmable fusion pixels and the control unit for programming signals from the control unit and transmitting information generated by the capacitance sensor array chip with programmable fusion pixels to an external processor.

In an embodiment, the controlling system further comprises an optical imaging device for recording the sample to generate an optical pattern.

In an embodiment, the optical pattern is used to verify the correlation of a capacitance pattern obtained by the controlling system after sampling the sample.

In an embodiment, the controlling system is used to capture a first noise, wherein the first noise is fixed pattern noise on the capacitance sensor array chip with programmable fusion pixels.

In an embodiment, the controlling system is used to perform continuous sampling of the sample to obtain multiple frames.

In an embodiment, the programmable substrate is used to average the multiple frames to eliminate a second noise and to obtain an external shape characteristic of the sample, wherein the second noise is random noise.

In an embodiment, the programmable substrate further removes the first noise from the external shape characteristic of the sample to obtain a pure sample value for the sample.

The capacitance sensor array chip with programmable fusion pixels, sampling device and controlling system provided by the present inventive concept are capable of merging interface, read-out and sampling circuits in pixels and dynamically adjusting electrode sizes according to the characteristics of the biological samples to be tested. This not only improves the sensing performance, but also optimizes the sampling sensitivity by a given fusion-pixel pattern.

BRIEF DESCRIPTION OF THE DRAWINGS

FIGS. 6(*a*) and 6(*b*) respectively illustrate a schematic diagram and a cross-sectional diagram of the sampling device according to a sixth embodiment of the present inventive concept.

DETAILED DESCRIPTION

The present inventive concept is described by the following specific embodiments. Those with ordinary skills in the arts can readily understand other advantages and functions of the present inventive concept after reading the disclosure of this specification. Any changes or adjustments made to their relative relationships, without modifying the substantial technical contents, are also to be construed as within the range implementable by the present inventive concept.

Figure 1:
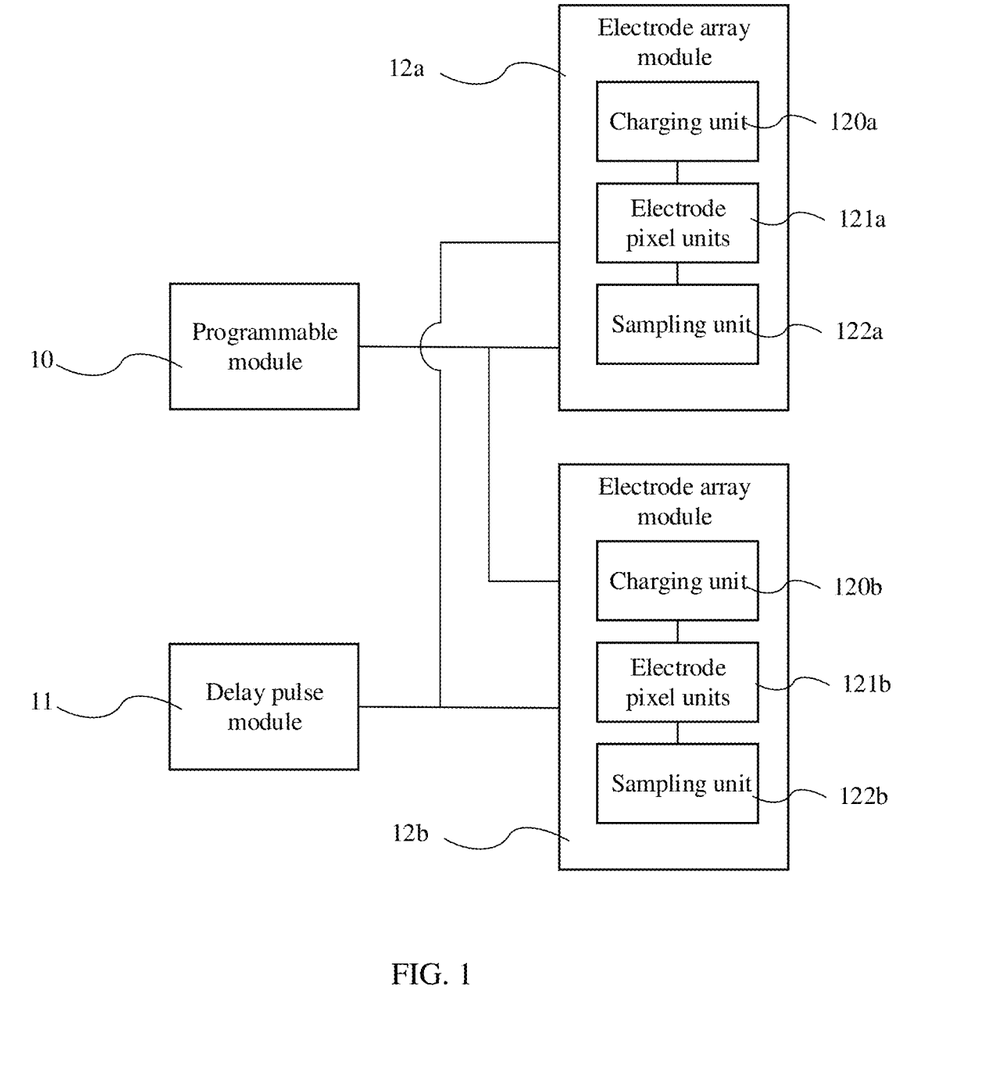
FIG. 1 illustrates a functional block diagram of the capacitance sensor array chip with programmable fusion pixels according to a first embodiment of the present inventive concept.

Please refer to FIG. 1 which illustrates a functional block diagram of the capacitance sensor array chip with programmable fusion pixels according to a first embodiment of the present inventive concept. As shown in the figure, the capacitance sensor array chip with programmable fusion pixels according to the present inventive concept comprises a programmable module 10, a delay pulse module 11 and multiple electrode array modules 12*a*, 12*b*. For example, the capacitance sensor array chip with programmable fusion pixels according to the present inventive concept may comprise two electrode array modules 12*a*, 12*b* in the embodiment of FIG. 1, but it is not limited thereto. In other embodiments, the capacitance sensor array chip may comprise more electrode array modules.

The programmable module 10 is used for generating a choosing signal according to a first clock signal. The delay pulse module 11 is used for generating a third clock signal according to a second clock signal and a sensing pulse signal. The electrode array module 12*a* comprises a charging unit 120*a*, multiple electrode pixel units 121*a* and a sampling unit 122*a*. Likewise the electrode array module 12*b* comprises a charging unit 120*b*, multiple electrode pixel units 121*b* and a sampling unit 122*b*.

The charging units 120*a*, 120*b* are used for generating a charging signal according to the sensing pulse signal. For example, the capacitance value of the electrode pixel unit 121*a* will change when an object contacts the electrode pixel unit 121*a*, and the charging unit 120*a* is further used to convert this change of the capacitance value into a difference of the charging time.

The multiple electrode pixel units 121*a* form an M×N array, wherein M is a positive integer greater than or equal to 1 and N is a positive integer greater than or equal to 1. Likewise, the multiple electrode pixel units 121*b* form an M×N array. The electrode array module 12a chooses a certain pattern of the electrode pixel units 121a in orders according to the choosing signal and the certain pattern of the electrode pixel units 121a in the electrode array module 12a generates a sampling signal according to the charging signal. The sampling unit 122a is used for generating a sensing output signal according to the sampling signal and the third clock signal. The electrode array module 12b works in the same manner as the electrode array module 12a does. More specifically, the delay pulse module 11 is used for generating the third clock signal. According to the third clock signal, it is determined whether the sampling unit 122a of the electrode array module 12a generates the sensing output signal or the sampling unit 122b of the electrode array module 12b generates the sensing output signal.

The programmable module 10 is used for generating the choosing signal, and the electrode array module 12a chooses a certain pattern of the electrode pixel units 121a according to the choosing signal. For example, the certain pattern may be 1×1, 1×2, 2×2, 2×4 or 4×4, and so on, but it is not limited thereto. The certain pattern can be selected appropriately according to the size of the sample to be tested.

A capacitive sensing array sampling circuit in the prior art, such as ADC, usually requires large area and complex system to reach high precision. Therefore, the sampling circuit in the prior art is difficult to be embedded into the pixels of the sensing array, which limits the throughput of sensing signals. Compared to the prior art, the capacitance sensor array chip with programmable fusion pixels of the present inventive concept realizes time-sharing time-to-digital converter (ts-TDC) by integrating the charging unit 120a, multiple electrode pixel units 121a, and the sampling unit 122a in the electrode array module 12a and the control of the programmable module 10 and the delay pulse module 11. This approach allows the capacitance sensor array chip to work in global shutter mode and frees up more area under the electrode, as well as holds the potential for multi-modality integration in the future. The programmable electrode shape in this design also allows the digital image processing to be improved through the acquisition of multiple frames of the same or different patterns, which leads to an enhanced sensing performance.

Figure 2:
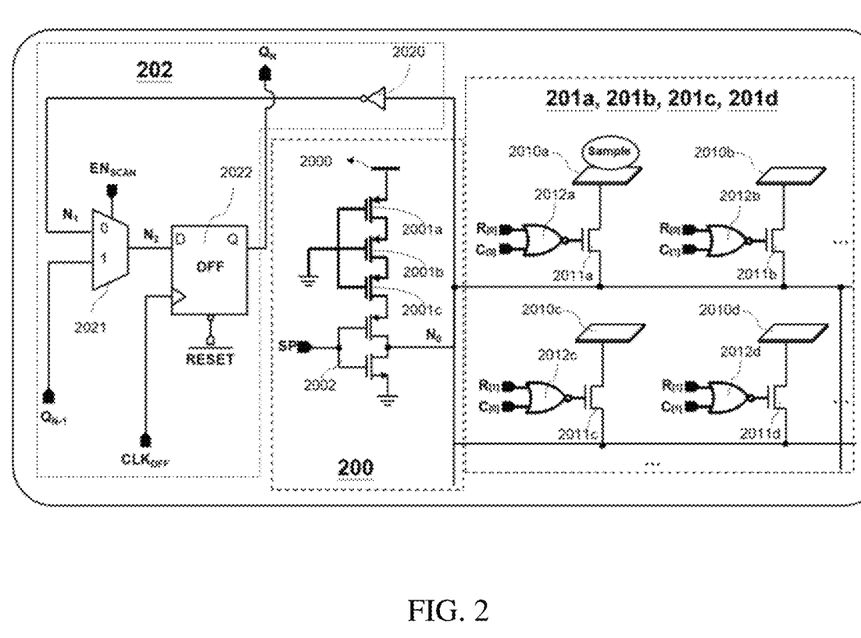
FIG. 2 illustrates a schematic circuit diagram of the electrode array module of the capacitance sensor array chip with programmable fusion pixels according to a second embodiment of the present inventive concept.

Please refer to FIG. 2 which illustrates a schematic circuit diagram of the electrode array module of the capacitance sensor array chip with programmable fusion pixels according to a second embodiment of the present inventive concept. In an embodiment, the electrode array module 20 comprises a charging unit 200, electrode pixel units 201a, 201b, 201c, 201d and a sampling unit 202. The electrode pixel units 201a comprises an electrode 2010a, a first transistor 2011a with a drain connected to the electrode 2010a and a switching logic gate 2012a. Wherein an input terminal of the switching logic gate 2012a receives the choosing signal, and an output terminal of the switching logic gate 2012a is connected to a gate of the first transistor 2011a. Similarly, electrode pixel units 201b, 201c, 201d comprise electrodes 2010b, 2010c, 2010d, the first transistors 2011b, 2011c, 2011d, and switching logic gates 2012b, 2012c, 2012d, respectively.

In an embodiment, the first transistors 2011a, 2011b, 2011c, 2011d may be NMOS transistors or PMOS transistors, but it is not limited thereto. Each of the switching logic gates 2012a, 2012b, 2012c, 2012d may be a logic gate such as NOR, NAMD, etc., or may be implemented as a single NMOS, but it is not limited thereto.

In the embodiment of FIG. 2, each of the electrode pixel units 201a, 201b, 201c, 201d is 2×2 electrode pixel units as an example, but it is not limited thereto.

In an embodiment, the choosing signal comprises an M-bit Row signal R[0]-R[M−1] and an N-bit Column signal C[0]-C[N−1].

In an embodiment, the charging unit 200 comprises a first voltage source 2000, first PMOS 2001a, 2001b, 2001c connected to the first voltage source 2000 and a first CMOS inverter 2002 connected to the first PMOS 2001c. Wherein an input of the first CMOS inverter 2002 receives the sensing pulse signal SP and an output of the first CMOS inverter 2002 outputs the charge signal. For example, there are three first PMOS 2001a, 2001b, 2001c in the embodiment of FIG. 2, but it is not limited thereto. In other embodiments, more or less first PMOS may be used to adjust the current.

In an embodiment, the sampling unit 202 comprises a first INV 2020, a second multiplexer 2021 and a second D-flip flop, DFF, 2022. The first INV 2020 has an input terminal which receives the sampling signal, and the second multiplexer 2021 has a first input terminal connected to an output terminal of the first INV 2020. Wherein a clock input terminal of the second DFF 2022 receives the third clock signal, an input terminal of the second DFF 2022 is connected to an output terminal of the second multiplexer 2021, and an output terminal of the second DFF 2022 outputs the sensing output signal and is connected to a second input terminal of the second multiplexer of the sampling unit of the next electrode array module to form a serial output. In other words, the signal $Q_n$ is transmitted to the next electrode array module and the signal $Q_{n-1}$ is received from the previous electrode array module.

In an embodiment, the first INV 2020 may be a Hi-Skew inverter to enhance the sensing effect.

Figure 3:
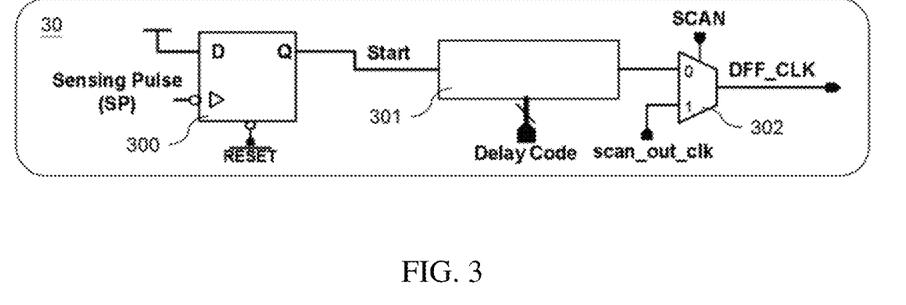
FIG. 3 illustrates a schematic circuit diagram of the delay pulse module of the capacitance sensor array chip with programmable fusion pixels according to a third embodiment of the present inventive concept.

Please refer to FIG. 3 which illustrates a schematic circuit diagram of the delay pulse module of the capacitance sensor array chip with programmable fusion pixels according to a third embodiment of the present inventive concept. In an embodiment, the delay pulse module 30 comprises a first DFF 300, a delay pulse delay generator 301 connected to an output terminal of the first DFF 300 and a first multiplexer 302. The first DFF 300 has a clock input terminal which receives the sensing pulse signal SP. Wherein a first input terminal of the first multiplexer 302 is connected to an output terminal of the delay pulse delay generator 301, a second input terminal of the first multiplexer 302 receives the second clock signal scan_out_clk, and an output terminal of the first multiplexer 302 outputs the third clock signal DFF_CLK.

Figure 4:
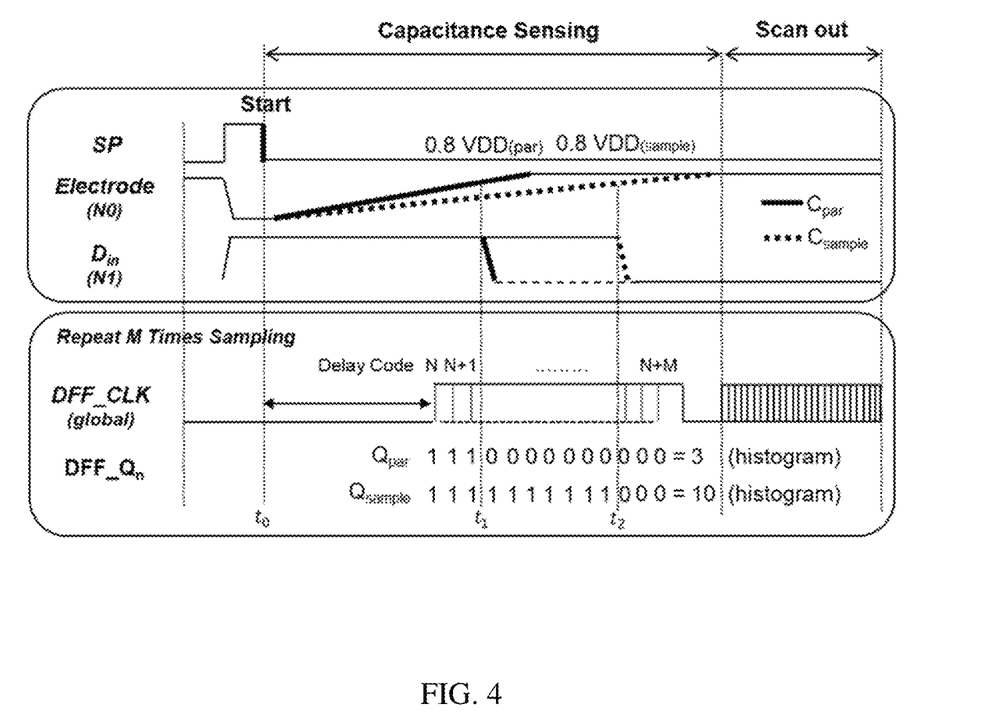
FIG. 4 illustrates timing waveforms according to a fourth embodiment of the present inventive concept.

Please refer to FIG. 4 which illustrates timing waveforms according to a fourth embodiment of the present inventive concept. As shown in the figure, it comprises the sensing pulse signal SP and a voltage signal Electrode (N0) of the electrode pixel unit. $D_{in}$ (N1) is the input signal of the second DFF. The third clock signal DFF_CLK is the clock input signal of the second DFF. The sensing output signal DFF_Qn is the output signal of the second DFF. Firstly, the charging unit is used to convert the capacitance into time. When the sensing pulse signal SP is at a low potential, the first voltage source starts to charge the electrode pixel unit. The output of the first INV is turned off until the voltage signal Electrode (N0) of the electrode pixel unit reaches 0.8 VDD. Then, the second DFF performs sampling at Delay Code N. FIG. 4 shows the conditions without sample ($C_{par}$) and with sample ($C_{sample}$), and both of the signal $Q_{par}$ and the signal $Q_{sample}$ would be logic 1. These processes will be repeated several times with a slight delay in the sampling time by the second DFF. For the signal $Q_{par}$ after time t1, since it reaches 0.8 VDD earlier, the signal $Q_{par}$ becomes logic 0, while the signal $Q_{sample}$ remains logic 1. For the signal $Q_{sample}$ after time t2, it will eventually drop to logic 0. Lastly, all the Q values are summed up to give the exact time difference between the two conditions. Its corresponding capacitance measurement result can be inferred thereby. The design scheme of the present inventive concept is capable of embedding a sampling circuit into pixels and uses only one simple delay pulse delay generator to achieve the objective.

Figure 5:
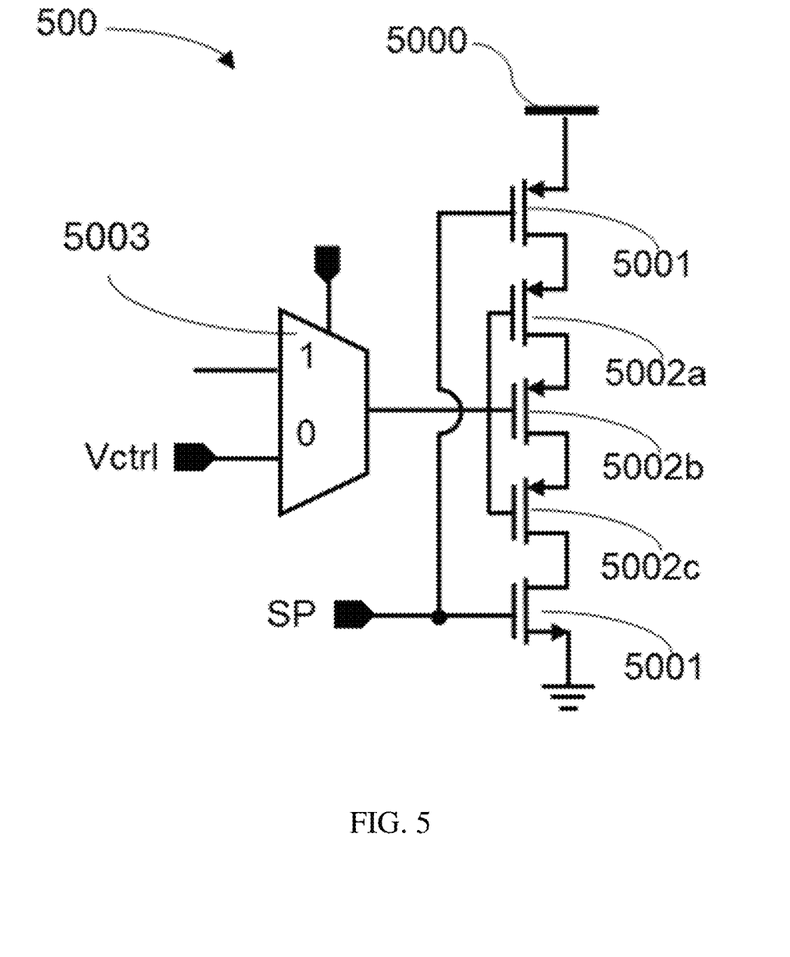
FIG. 5 illustrates a schematic circuit diagram of the charging unit of the capacitance sensor array chip with programmable fusion pixels according to a fifth embodiment of the present inventive concept.

Please refer to FIG. 5 which illustrates a schematic circuit diagram of the charging unit of the capacitance sensor array chip with programmable fusion pixels according to a fifth embodiment of the present inventive concept. In an embodiment, the charging unit 500 comprises a second voltage source 5000, a second CMOS inverter 5001 connected to the second voltage source 5000, second PMOS 5002a, 5002b, 5002c connected to the second CMOS inverter 5001 and a third multiplexer 5003 connected to the second PMOS 5002b. Wherein a first input terminal of the third multiplexer 5003 is connected to a control voltage Vctrl, and when the third multiplexer 5003 selects the first input terminal, an output current of the second PMOS 5002a, 5002b, 5002c can be controlled via the control voltage Vctrl, thereby adjusting the sensing magnification (sensitivity). An input terminal of the second CMOS inverter 5001 receives the sensing pulse signal SP and an output terminal of the second CMOS inverter 5001 outputs the charging signal. for example, there are three second PMOS 5002a, 5002b, 5002c in the embodiment of FIG. 5, but it is not limited thereto. In other embodiments, more or less second PMOS may be used to adjust the current.

In an embodiment, the electrode pixel units may be arranged as square electrodes, interleaved electrodes or aligned electrodes, and the electrode pixel units may include or not include a guard ring.

In an embodiment, the electrode pixel units may be made of a material for a top metal or a material for a sub-layer metal.

Figure 6A:
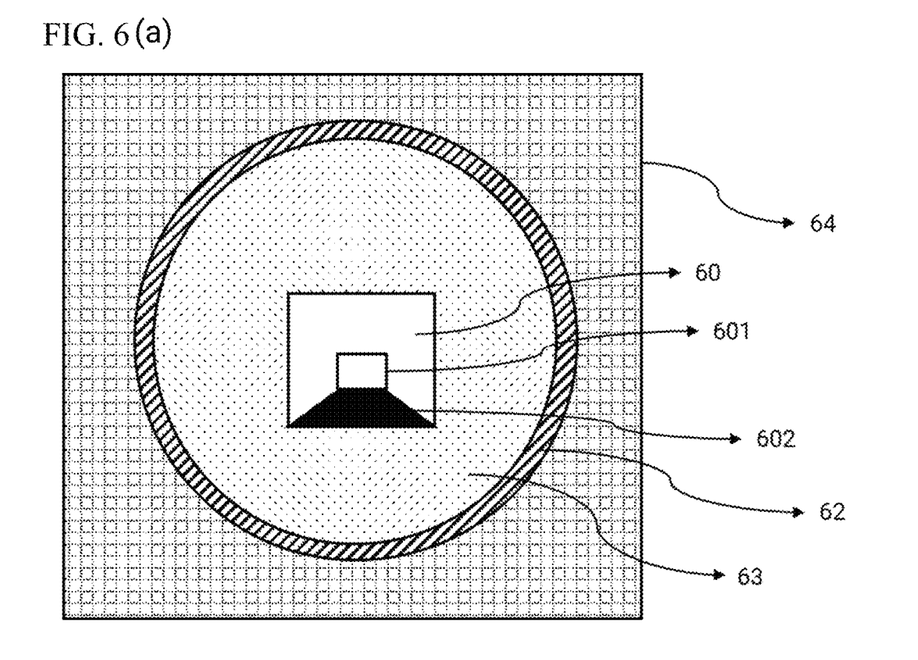
Figure 6B:
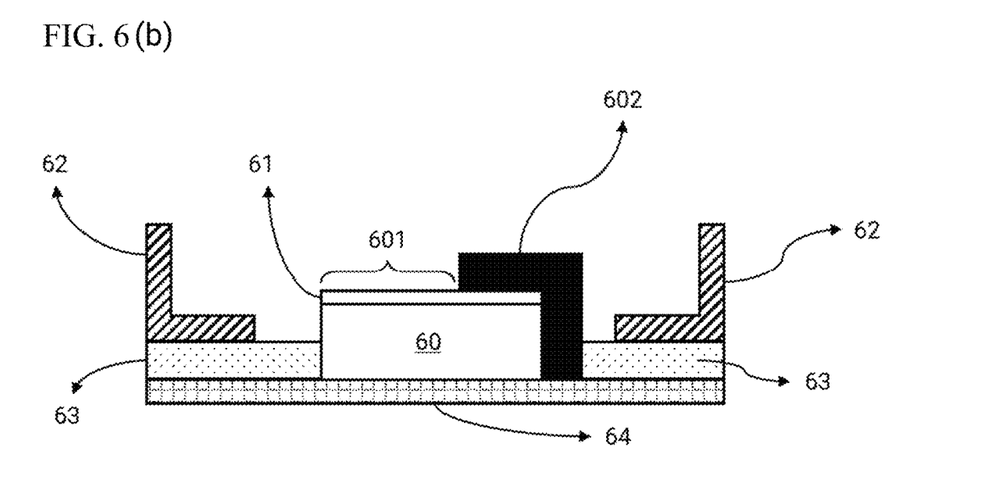

Please refer to FIG. 6. FIGS. 6(a) and 6(b) respectively illustrate a schematic diagram and a cross-sectional diagram of the sampling device according to a sixth embodiment of the present inventive concept. The sampling device of the present inventive concept may comprise the capacitance sensor array chip with programmable fusion pixels 60 according to the first aspect of the present inventive concept; a protective layer 61 covering the capacitance sensor array chip with programmable fusion pixels 60; a container 62 used for disposing the capacitance sensor array chip with programmable fusion pixels 60; and an insulator 63 disposing around the capacitance sensor array chip with programmable fusion pixels 60 to securely bond the container 62 to the capacitance sensor array chip with programmable fusion pixels 60.

In an embodiment, the capacitance sensor array chip with programmable fusion pixels 60 may also be fixed on a printed circuit board 64 by the insulator 63, such as, but not limited to, a high resistance, non-conductive medical epoxy resin, thereby effectively shielding the metal wires of the chip.

In an embodiment, the capacitance sensor array chip with programmable fusion pixels 60 comprises a sensing area 601. Preferably, the top of the sensing area 601 can contact the biological sample to be tested.

In an embodiment, the capacitance sensor array chip with programmable fusion pixels 60 further comprises bonding wires 602, which may be secured and protected by using another insulating material to prevent the bonding wire from interacting with liquids or solutions. In an embodiment, the capacitance sensor array chip with programmable fusion pixels 60 is bonded on one side only to ensure that there is sufficient space available for other operations.

According to the present inventive concept, a layer of medical epoxy resin 63 may be coated and cured around the capacitance sensor array chip with programmable fusion pixels 60. Subsequently, a laser-cut container, such as a petri dish 62, is mounted on the printed circuit board 64 and the medical epoxy resin is recured. This petri dish can be used to contain culture media and cells, allowing for cell growth and interaction.

Figure 7:
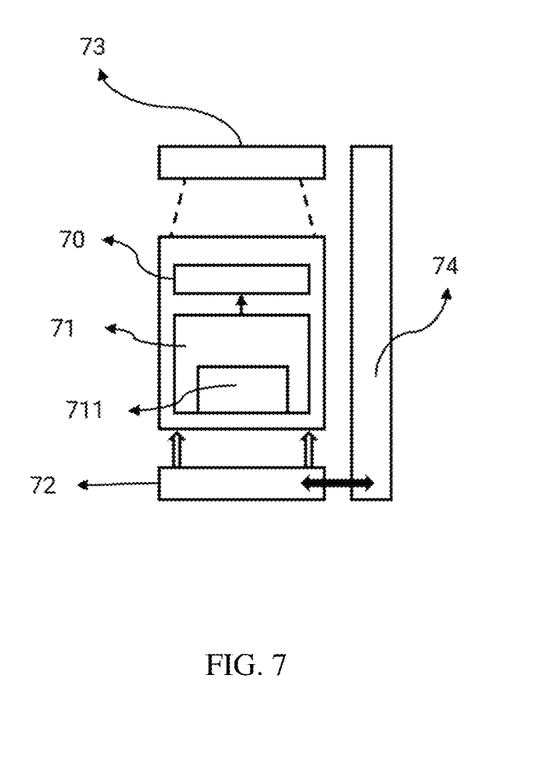
FIG. 7 illustrates a schematic diagram of the controlling system according to a seventh embodiment of the present inventive concept.

Please refer to FIG. 7 which illustrates a schematic diagram of the controlling system according to a seventh embodiment of the present inventive concept. Please refer to FIG. 1 and FIG. 7 together. The controlling system of the present inventive concept is used to control the capacitance sensor array chip with programmable fusion pixels to sense a sample. Wherein the controlling system comprises the capacitance sensor array chip with programmable fusion pixels 70; and a control unit 71 for determining a resistance value and a capacitance value when the capacitance sensor array chip with programmable fusion pixels 70 is sampling the sample in order to control the electrode pixel unit 121a.

In an embodiment, the control unit 70 may further comprise a shift register 711 to determine the resistance value and capacitance value when the capacitance sensor array chip with programmable fusion pixels 70 is sampling the sample in order to formulate an equivalent electrode size.

In an embodiment, the shift register 711 may be an (M+N)-bit shift register.

Please refer to FIG. 3 again. In an embodiment, the control unit 71 may also be used to generate a pulse after sensing the sensing pulse signal SP and send it to the delay pulse delay generator 301.

In an embodiment, the controlling system further comprises a programmable substrate 72 connected to the capacitance sensor array chip with programmable fusion pixels 70 and the control unit 71 in order to program signals from the control unit and to transmit information generated by the capacitance sensor array chip with programmable fusion pixels 70 to an external processor 74.

In an embodiment, the programmable substrate 72 may be, for example, but is not limited to, a Field Programmable Gate Array (FPGA) board.

In an embodiment, the controlling system may further comprise an optical imaging device 73 for recording the sample to generate an optical pattern. According to the present inventive concept, the optical imaging device 73 may be, for example, a microscope, but it is not limited thereto. In an embodiment, the optical pattern can be used to verify the correlation of a capacitance pattern obtained by the controlling system after the capacitance sensor array chip with programmable fusion pixels samples the sample.

Specifically, the controlling system provided by the present inventive concept can be used to capture a first noise, wherein the first noise is a fixed pattern noise on the capacitance sensor array chip with programmable fusion pixels.

In an embodiment, the controlling system can be used to perform continuous sampling of the sample to obtain multiple frames. In a preferred embodiment, the programmable substrate can be used to average the multiple frames to eliminate a second noise and to obtain an image of the sample, wherein the second noise is random noise.

In a preferred embodiment, the programmable substrate may further remove the first noise from the image of the sample to obtain a pure sample value for the sample.

Figure 8:
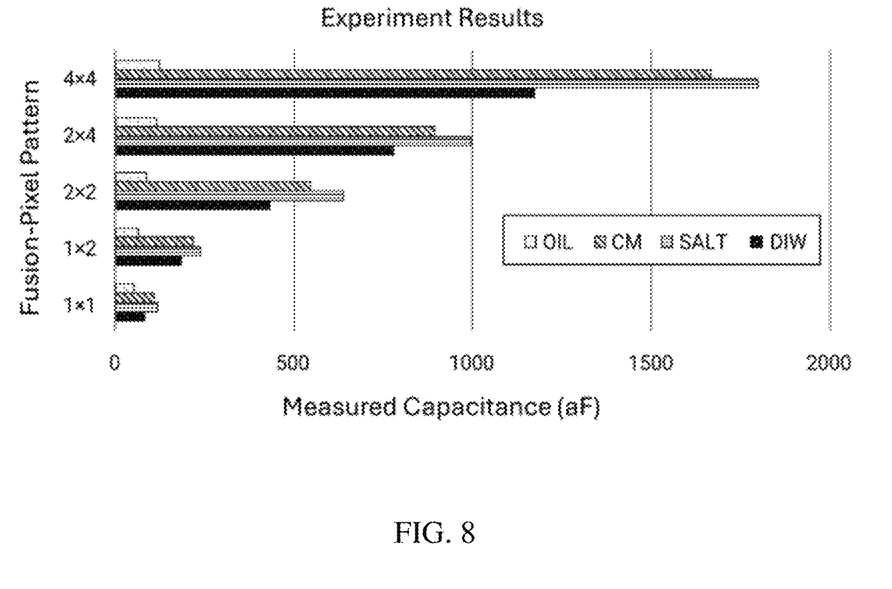
FIG. 8 shows the capacitance values of different samples sampled in different fusion-pixel patterns chosen by the controlling system according to an eighth embodiment of the present inventive concept.

Please refer to FIG. 8 which shows the capacitance values of different samples sampled in different fusion-pixel patterns chosen by the controlling system according to an eighth embodiment of the present inventive concept.

FIG. 8 shows that each electrode unit samples the samples with dynamically adjusted pixel patterns which are a 1×1, 1×2, 2×2, 2×4, and 4×4, respectively by the controlling system provided by the present inventive concept, and the samples include silicon oil (OIL), StemFlex™ stem cell culture medium (CM), saturated salt solution (SALT), and deionized water (DIW). The measured capacitances reflect the scales of the relative permittivities. The resulted values are sorted in descending order, SALT, CM, DIW, and OIL. This is consistent with the results from the previous study.

Figure 9:
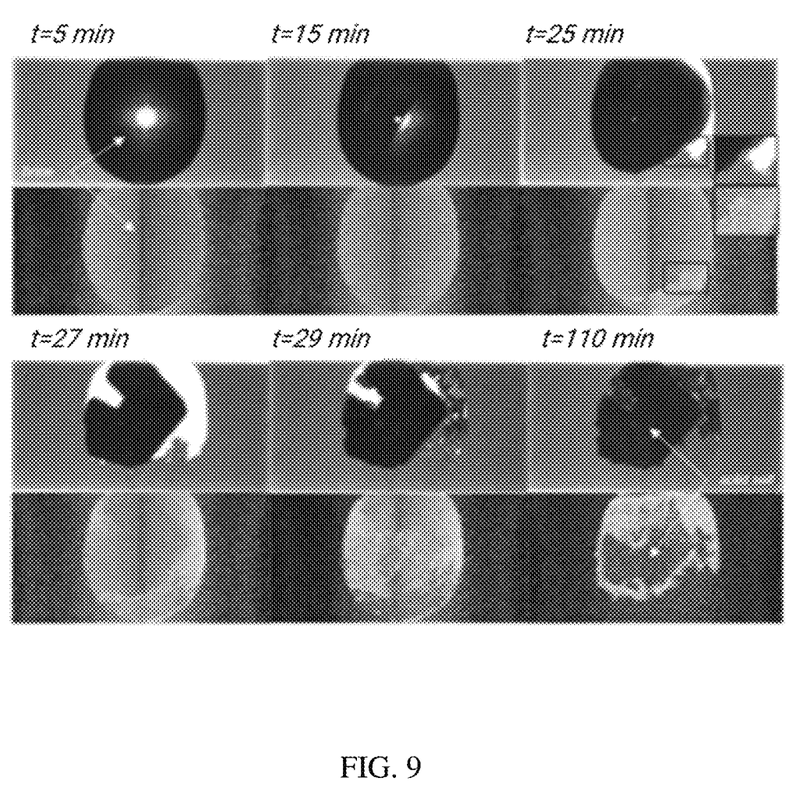
FIG. 9 shows the real-time results of monitoring the sample by the controlling system according to a ninth embodiment of the present inventive concept.

Please refer to FIG. 9 which shows the real-time results of monitoring the sample by the controlling system according to a ninth embodiment of the present inventive concept. The real-time monitoring times are t=5, 15, 25, 27, 29 and 110 minutes respectively. Saturated salt solution is used as the target sample. Ten (10) µL of saturated salt solution is dropped at room temperature on the surface of the capacitance sensor array chip with programmable fusion pixels provided by the present inventive concept. The liquid and solid test results are observed. In this embodiment, 4×4 fusion pixels are enabled. FIG. 9 shows that the liquid droplet gradually becomes smaller before t=27 min. Afterward, several pieces of salt crystal appear. Only the shape of the crystals is reflected on the image because there is no direct contact between the crystals and the surface of the chip. It represents the longer distance between the sample and the chip, the minor change of the capacitance induced by the electrode.

The present inventive concept provides a capacitance sensor array chip with programmable fusion pixels, a sampling device and a controlling system capable of efficiently adjusting the electrode size according to the biological sample size properly to obtain better sensing results and to balance spatial resolution and sensitivity at the same time. The present inventive concept also utilizes the time-sharing time-to-digital conversion method and the noise-cancellation method to achieve a higher number of pixels in global shutter mode, and the sampling results match the morphology of the optical imaging device. The present inventive concept integrates multiple functions and contributes to the development of a large number of biological applications and personalized medicine.

What is claimed is:

1. A capacitance sensor array chip with programmable fusion pixels, which comprises:
    a programmable module for generating a choosing signal according to a first clock signal;
    a delay pulse module for generating a third clock signal according to a second clock signal and a sensing pulse signal; and
    multiple electrode array modules, each of which comprises:
        a charging unit for generating a charging signal according to the sensing pulse signal;
        M×N of electrode pixel units forming an array, wherein M is a positive integer greater than or equal to 1 and N is a positive integer greater than or equal to 1; and
        wherein the electrode array module chooses a certain pattern of the electrode pixel units according to the choosing signal in orders and the certain pattern of the electrode pixel units in the electrode array module generates a sampling signal according to the charging signal; and
    a sampling unit for generating a sensing output signal according to the sampling signal and the third clock signal.

2. The capacitance sensor array chip with programmable fusion pixels of claim 1, wherein each of the electrode pixel units comprises:
    an electrode;
    a first transistor with a drain connected to the electrode; and
    a switching logic gate, wherein an input terminal of the switching logic gate receives the choosing signal, and an output terminal of the switching logic gate is connected to a gate of the first transistor.

3. The capacitance sensor array chip with programmable fusion pixels of claim 2, wherein the electrode pixel units are arranged as square electrodes, interleaved electrodes or aligned electrodes, and the electrode pixel units include or do not include a guard ring.

4. The capacitance sensor array chip with programmable fusion pixels of claim 3, wherein the electrode pixel units are made of a material for a top metal or a material for a sub-layer metal.

5. The capacitance sensor array chip with programmable fusion pixels of claim 1, wherein the choosing signal comprises an M-bit Row signal and an N-bit Column signal.

6. The capacitance sensor array chip with programmable fusion pixels of claim 1, wherein the charging unit comprises:
    a first voltage source;
    at least one first PMOS connected to the first voltage source; and
    a first CMOS inverter connected to the at least one first PMOS;
    wherein an input of the first CMOS inverter receives the sensing pulse signal and an output of the first CMOS inverter outputs the charge signal.

7. The capacitance sensor array chip with programmable fusion pixels of claim 1, wherein the charging unit comprises:
    a second voltage source;
    a second CMOS inverter connected to the second voltage source;
    at least one second PMOS connected to the second CMOS inverter; and
    a third multiplexer connected to the at least one second PMOS, wherein a first input terminal of the third multiplexer is connected to a control voltage, and when the first input is selected by the third multiplexer, an output current of the at least one second PMOS is controlled via the control voltage;
    wherein an input terminal of the second CMOS inverter receives the sensing pulse signal and an output terminal of the second CMOS inverter outputs the charging signal.

8. The capacitance sensor array chip with programmable fusion pixels of claim 1, wherein the delay pulse module comprises:
    a first DFF having a clock input terminal which receives the sensing pulse signal;
    a delay pulse delay generator (DPDG) connected to an output of the first DFF; and
    a first multiplexer;

wherein a first input terminal of the first multiplexer is connected to an output terminal of the delay pulse delay generator, a second input terminal of the first multiplexer receives the second clock signal and an output terminal of the first multiplexer outputs the third clock signal.

9. The capacitance sensor array chip with programmable fusion pixels of claim 1, wherein the sampling unit comprises:
a first INV having an input terminal which receives the sampling signal;
a second multiplexer having a first input terminal which is connected to an output terminal of the first INV; and
a second DFF;
wherein a clock input of the second DFF receives the third clock signal, an input of the second DFF is connected to an output of the second multiplexer and wherein an output of the second DFF outputs the sensing output signal and is connected to a second input of the second multiplexer of the sampling unit of the next electrode array module to form a serial output.

10. The capacitance sensor array chip with programmable fusion pixels of claim 9, wherein the first INV is a Hi-Skew inverter.

11. A sampling device, comprising:
the capacitance sensor array chip with programmable fusion pixels according to claim 1;
a protective layer covering the capacitance sensor array chip with programmable fusion pixels;
a container for disposing the capacitance sensor array chip with programmable fusion pixels; and
an insulator disposing around the capacitance sensor array chip with programmable fusion pixels to securely bond the container to the capacitance sensor array chip with programmable fusion pixels.

12. A controlling system for controlling a capacitance sensor array chip with programmable fusion pixels to sense a sample, wherein the controlling system comprises:
the capacitance sensor array chip with programmable fusion pixels according to claim 1; and
a control unit for determining a resistance value and a capacitance value when the capacitance sensor array chip with programmable fusion pixels is sampling the sample in order to control the electrode pixel units.

13. The controlling system of claim 12, wherein the control unit comprises a shift register to determine the resistance value and capacitance value when the capacitance sensor array chip with programmable fusion pixels is sampling the sample to formulate an equivalent electrode size, wherein the shift register is an (M+N)-bit shift register.

14. The controlling system of claim 12, wherein the controlling system further comprises a programmable substrate connected to the capacitance sensor array chip with programmable fusion pixels and the control unit in order to program signals from the control unit and to transmit information generated by the capacitance sensor array chip with programmable fusion pixels to an external processor.

15. The controlling system of claim 12, wherein the controlling system further comprises an optical imaging device for recording the sample to generate an optical pattern.

16. The controlling system of claim 15, wherein the optical pattern is used to verify the correlation of a capacitance pattern obtained by the controlling system after the capacitance sensor array chip with programmable fusion pixels samples the sample.

17. The controlling system of claim 16, wherein the controlling system is used to capture a first noise, wherein the first noise is a fixed pattern noise on the capacitance sensor array chip with programmable fusion pixels.

18. The controlling system of claim 17, wherein the controlling system is used to perform continuous sampling of the sample to obtain multiple frames.

19. The controlling system of claim 18, wherein the programmable substrate is used to average the multiple frames to eliminate a second noise and to obtain an image of the sample, wherein the second noise is a random noise.

20. The controlling system of claim 19, wherein the programmable substrate further removes the first noise from the image of the sample to obtain a pure sample value for the sample.

* * * * *